US012601054B2

(12) United States Patent
Watabe

(10) Patent No.: US 12,601,054 B2
(45) Date of Patent: Apr. 14, 2026

(54) METHOD FOR PRODUCING A GALLIUM OXIDE SEMICONDUCTOR FILM AND A FILM FORMING APPARATUS

(71) Applicant: SHIN-ETSU CHEMICAL CO., LTD., Tokyo (JP)

(72) Inventor: Takenori Watabe, Annaka (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 560 days.

(21) Appl. No.: 18/013,370

(22) PCT Filed: May 17, 2021

(86) PCT No.: PCT/JP2021/018526
§ 371 (c)(1),
(2) Date: Dec. 28, 2022

(87) PCT Pub. No.: WO2022/009524
PCT Pub. Date: Jan. 13, 2022

(65) Prior Publication Data
US 2023/0257880 A1    Aug. 17, 2023

(30) Foreign Application Priority Data

Jul. 8, 2020    (JP) ................................. 2020-117919
Jan. 4, 2021    (JP) ................................. 2021-000265

(51) Int. Cl.
*C23C 16/455*        (2006.01)
*C23C 16/40*         (2006.01)
(Continued)

(52) U.S. Cl.
CPC ........ *C23C 16/45517* (2013.01); *C23C 16/40* (2013.01); *C23C 16/4486* (2013.01);
(Continued)

(58) Field of Classification Search
CPC .............. C23C 16/45517; C23C 16/40; C23C 16/4486; C23C 16/45591; C23C 16/0272;
(Continued)

(56) References Cited

U.S. PATENT DOCUMENTS 3,757,733 A     9/1973  Reinberg
6,539,891 B1    4/2003  Lee et al.
(Continued)

FOREIGN PATENT DOCUMENTS

JP     H01-257337 A     10/1989
JP     H07-007157 U     1/1995
(Continued)

OTHER PUBLICATIONS

Jul. 13, 2021 International Search Report issued in International Patent Application No. PCT/JP2021/018526.
(Continued)

*Primary Examiner* — Dale E Page
*Assistant Examiner* — Quovaunda Jefferson
(74) *Attorney, Agent, or Firm* — OLIFF PLC

(57)        ABSTRACT

A method for producing a gallium oxide semiconductor film by a mist CVD method, including, a mist-forming step in which a raw material solution containing gallium is misted in a mist-forming unit to generate mist, a carrier gas supply step of supplying a carrier gas for transferring the mist to the mist-forming unit, a transferring step of transferring the mist from the mist-forming unit to a film forming chamber using the carrier gas via a supply pipe connecting the mist-forming unit and the film forming chamber, a rectification step of rectifying flow of the mist and the carrier gas supplied to a surface of a substrate in the film forming chamber so as to flow along the surface of the substrate, a film forming step
(Continued)

of heat-treating the rectified mist to form a film on the substrate, and an exhaust step of exhausting waste gas upward from the substrate.

21 Claims, 2 Drawing Sheets

(51) Int. Cl.
  *C23C 16/448*          (2006.01)
  *H01L 21/02*           (2006.01)
(52) U.S. Cl.
  CPC .. *C23C 16/45591* (2013.01); *H01L 21/02565* (2013.01); *H01L 21/0262* (2013.01)
(58) Field of Classification Search
  CPC ........... H01L 21/02565; H01L 21/0262; H01L 21/02579; H01L 21/02271; H01L 21/02304; H01L 21/0242; H01L 21/02483; H01L 21/02488; H01L 21/02628; H01L 21/02175; C30B 25/14; C30B 25/165; Y02E 10/50; Y02P 70/50
  See application file for complete search history.

(56)                 References Cited

U.S. PATENT DOCUMENTS

| | | | | |
|---|---|---|---|---|
| 6,806,211 | B2 * | 10/2004 | Shinriki | ............ C23C 16/45578 438/785 |
| 2006/0249077 | A1 * | 11/2006 | Kim | .................. C23C 16/45519 118/723 MP |
| 2007/0134413 | A1 * | 6/2007 | Futagawa | ......... C23C 16/45589 118/729 |
| 2015/0225843 | A1 | 8/2015 | Oda et al. | |
| 2016/0222511 | A1 | 8/2016 | Sasaki et al. | |
| 2020/0208267 | A1 | 7/2020 | Kamio et al. | |
| 2021/0291222 | A1 | 9/2021 | Nishi | |
| 2022/0223406 | A1 | 7/2022 | Watabe et al. | |

FOREIGN PATENT DOCUMENTS

| | | |
|---|---|---|
| JP | H09-195056 A | 7/1997 |
| JP | H11-131238 A | 5/1999 |
| JP | 2003-502501 A | 1/2003 |
| JP | 2005-307238 A | 11/2005 |
| JP | 2012-046772 A | 3/2012 |
| JP | 2013-028480 A | 2/2013 |
| JP | 5397794 B1 | 1/2014 |
| JP | 2014-063973 A | 4/2014 |
| JP | 2014-157982 A | 8/2014 |
| JP | 2016-027636 A | 2/2016 |
| JP | 2016-051824 A | 4/2016 |
| JP | 2016-146442 A | 8/2016 |
| JP | 2016-157879 A | 9/2016 |
| JP | 2019-054167 A | 4/2019 |
| JP | 2020-002396 A | 1/2020 |
| WO | 2017/065251 A1 | 4/2017 |
| WO | 2020/026823 A1 | 2/2020 |
| WO | 2020/129625 A1 | 6/2020 |

OTHER PUBLICATIONS

May 11, 2021 Office Action issued in Japanese Patent Application No. 2021-000265.
May 31, 2022 Office Action issued in Japanese Patent Application No. 2021-126966.
Dec. 13, 2022 Office Action issued in Japanese Patent Application No. 2021-126966.
Jun. 7, 2022 Office Action issued in Japanese Patent Application No. 2021-126970.
Oct. 25, 2022 Office Action issued in Japanese Patent Application No. 2021-126970.
Jun. 7, 2022 Office Action issued in Japanese Patent Application No. 2021-126971.
Oct. 25, 2022 Office Action issued in Japanese Patent Application No. 2021-126971.
Jan. 10, 2023 International Preliminary Report on Patentability issued in International Application No. PCT/JP2021/018526.
Oct. 3, 2023 Office Action issued in Japanese Patent Application No. 2021-126970.
Jun. 27, 2024 extended Search Report issued in European Patent Application No. 21837589.7.
Zhang et al. "Recent progress of Ga2O3 materials and devices based on the low-cost vacuum-free Mist-CVD epitaxial growth method." Fundamental Research, 2023.
Jul. 10, 2025 Office Action issued in Chinese Patent Application No. 202180045966.5.
Mar. 19, 2025 Office Action issued in Korean Patent Application No. 10-2022-7046215.
Feb. 27, 2026 Office Action issued in Indian Patent Application No. 202448007566.

* cited by examiner

[FIG. 1]
101
102b
102a
130
103a
103b
105
106
104
104a
105a
109
120
312
300
310
321
308
[FIG. 2]
120
104
104a
105
105a
106
116
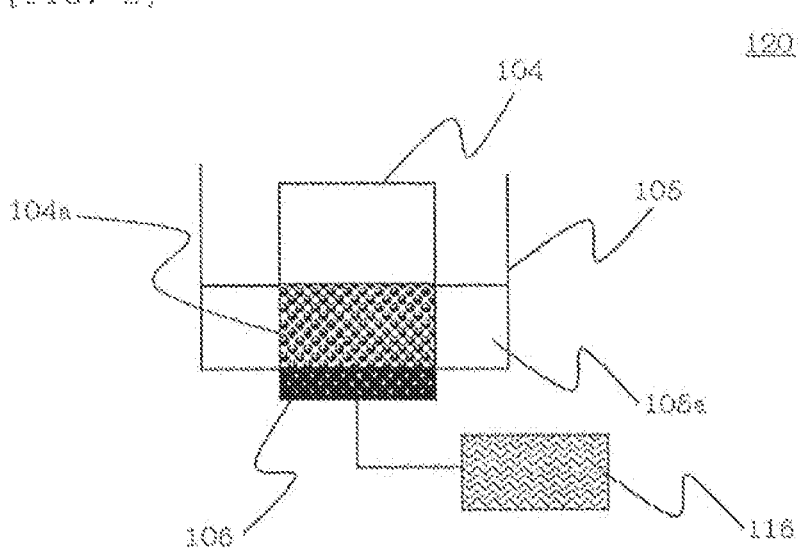

[FIG. 3]
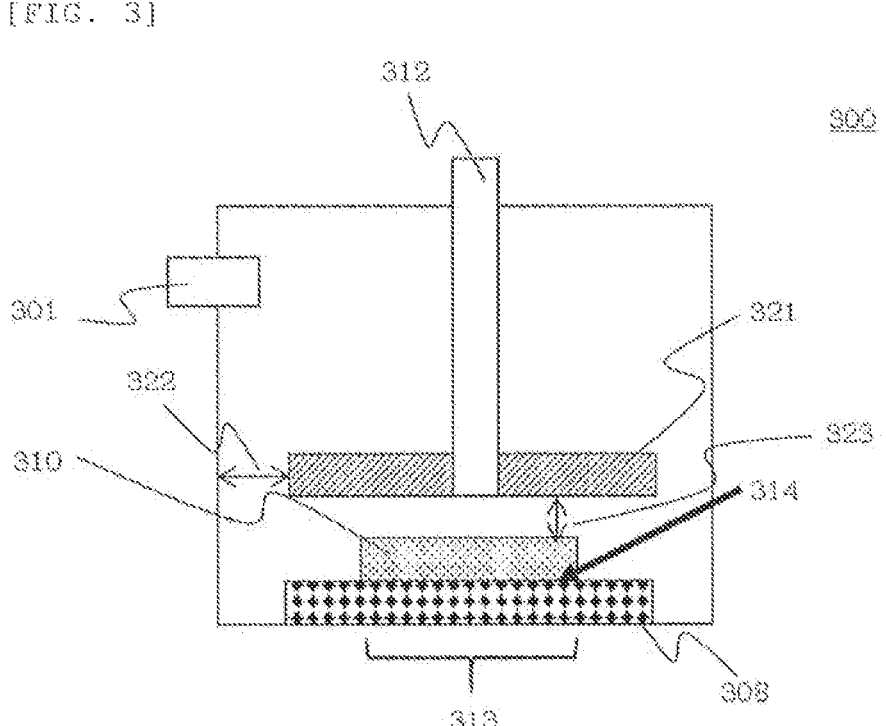

METHOD FOR PRODUCING A GALLIUM OXIDE SEMICONDUCTOR FILM AND A FILM FORMING APPARATUS

TECHNICAL FIELD

The present invention relates to a method for producing a gallium oxide semiconductor film and a film forming apparatus.

BACKGROUND ART

Conventionally, high vacuum film forming apparatus capable of realizing a non-equilibrium state such as pulsed laser deposition (PLD), molecular beam epitaxy (MBE), sputtering method, etc. has been developed so far. It has become possible to produce oxide semiconductors, which could not be produced by melt growth method or the like. In addition, a mist chemical vapor deposition (Mist CVD) method for growing a crystal on a substrate using an atomized mist-like raw material has been developed. It has become possible to fabricate gallium oxide ($\alpha$-$Ga_2O_3$) having a corundum structure. As a semiconductor with a large bandgap, $\alpha$-$Ga_2O_3$ is expected to toe applied to next-generation switching devices capable of achieving high breakdown voltage, low loss, and high heat resistance.

Regarding the mist CVD method, a tube furnace type mist CVD apparatus is disclosed in Patent Document 1. A fine channel type mist CVD apparatus is disclosed in Patent Document 2. A linear source type mist CVD apparatus is disclosed in Patent Document 3. A mist CVD apparatus for a tube furnace type is disclosed in Patent Document 4, and is different from the mist CVD apparatus disclosed in Patent Document 1, that a carrier gas is introduced into a mist generator. A mist CVD apparatus in which a substrate is installed above a mist generator is disclosed in Patent Document 5 and a susceptor is a rotary stage provided on a hot plate.

CITATION LIST

Patent Literature

Patent Document 1: JP H01-257337 A
Patent Document 2: JP 2005-307238 A
Patent Document 3: JP 2012-46772 A
Patent Document 4: JP 5397794 B2
Patent Document 5: JP 2014-63973 A
Patent Document 6: JP 2020-2396 A

SUMMARY OF INVENTION

Technical Problem

Unlike other CVD methods, the mist CVD method can form a film at a relatively low temperature, and can also produce a metastable phase crystal structure such as the corundum structure of $\alpha$-gallium oxide. However, the inventors of the present invention have found a new problem that if heating is performed in a film forming chamber for film formation by thermal reaction, the amount of supplied mist decreases exponentially, the film forming rate decreases, and in-plane uniformity of the film thickness becomes difficult to maintain. This problem has become more pronounced as the diameter of the substrate increased. Inventions described in Patent Documents 3 and 5 attempt to solve such problems by scanning and rotating the substrate. However, even if these methods are used, the in-plane uniformity of the film thickness cannot be completely resolved. In addition, providing the film forming apparatus with a driving unit for scanning and rotating increases the initial cost of the apparatus, and also causes secondary problems such as complicating maintenance.

On the other hand, in Patent Document 6, it is described that a means fox supplying mist in the opposite direction is provided on the side surface of the film forming chamber, and thus the in-plane uniformity of the film thickness is high and the film forming rate can be greatly improved. However, since the mist supply port is not completely symmetrical with respect to the substrate, the film thickness distribution varies to some extent, and improvement has been desired.

The present invention has been made to solve the above problems. It is an object of the present invention to provide a film forming apparatus to which a mist CVD method having an excellent in-plane uniformity of the film thickness and film forming rate can be applied, and a gallium oxide semiconductor film forming method having an excellent in-plane uniformity of the film thickness and film forming rate.

Solution to Problem

The present invention has been made to achieve the above objects, and provides a method for producing a gallium oxide semiconductor film by a mist CVD method, comprising, a mist-forming step in which a raw material solution containing gallium is misted in a mist-forming unit to generate mist, a carrier gas supply step of supplying a carrier gas for transferring the mist to the mist-forming unit, a transferring step of transferring the mist from the mist-forming unit to a film forming chamber using the carrier gas via a supply pipe connecting the mist-forming unit and the film forming chamber, a rectification step of rectifying flow of the mist and the carrier gas supplied to a surface of a substrate in the film forming chamber so as to flow along the surface of the substrate, a film forming step of heat-treating the rectified mist to form a film on the substrate, and an exhaust step of exhausting waste gas upward from the substrate.

According to such a method for producing a gallium oxide semiconductor film, it becomes possible to improve the in-plane uniformity of the film thickness and greatly improve the film forming rate by a simple method.

At this time, it is preferable that a substrate having an area of 100 mm$^2$ or more or a diameter of 2 inches (50 mm) or more is used as the substrate.

The method for producing a gallium oxide semiconductor film according to the present invention can achieve higher in-plane uniformity of film thickness even when using such a large-sized substrate that tends to have non-uniform film thickness.

Here, it is preferable that the flow of the mist and the carrier gas supplied to the surface of the substrate is rectified so as to flow from the outer circumference of the substrate toward the center of the substrate in the rectification step.

As a result, it becomes possible to increase the in-plane uniformity of the film thickness more reliably and greatly improve the film forming rate by a simpler method.

Further, it provides a film forming apparatus comprising at least, a mist-forming unit that turns a raw material solution into mist and generates mist, a carrier gas supply unit for supplying a carrier gas for transferring the mist, a supply pipe that connects the mist-forming unit and a film forming chamber, and through which the mist is transferred by the carrier gas, the film forming chamber for heat-treating the mist supplied together with the carrier gas from a supply port to form a film on a substrate mounted on a substrate mounting portion, wherein, inside the film forming chamber, a middle plate that rectifies flow of the mist and the carrier gas, and an exhaust pipe for exhausting waste gas, are provided, and wherein, the middle plate is positioned above the substrate mounting portion and between the supply port and the substrate mounting portion, and is installed so as to have a certain gap from a side wall of the film forming chamber the exhaust pipe is connected to an opening in a surface of the middle plate facing the substrate mounting portion, extends upward from the middle plate, and is provided to penetrate a wall of the film forming chamber and the flow of the mist supplied from the supply port to the film forming chamber together with the carrier gas is rectified by the middle plate so as to flow along a surface of the substrate, and the film is formed on the substrate.

According to such a film forming apparatus, the in-plane uniformity of the film thickness is high and the film forming rate is excellent, by the simple apparatus configuration.

At this time, it is preferable that, a substrate having an area of 100 mm² or more or a diameter of 2 inches (50 mm) or more is treated.

The film forming apparatus according to the present invention can obtain a higher in-plane uniformity of the film thickness even for a large-sized substrate on which the film, thickness tends to be non-uniform.

At this time, the film is formed on the substrate by arranging the flow of the mist supplied from the supply port to the film forming chamber together with the carrier gas being rectified by the middle plate so as to flow from the outer circumference of the substrate toward the center of the substrate.

As a result, the in-plane uniformity of the film thickness and the film forming rate can be improved more reliably with a simpler apparatus configuration.

At this time, it is preferable that the substrate mounting portion has a substrate mounting surface at a position higher than the outer circumference of the substrate mounting portion in an inside of the film forming chamber.

As a result, it becomes possible to suppress supply of the mist that has reacted outside the substrate onto the substrate, so that a higher quality film can be obtained.

At this time, it is preferable that a heating region for performing the heat-treating of the mist has the same size as the substrate mounting portion in the film forming chamber.

As a result, reaction of the mist outside the substrate can be further suppressed, and a higher quality film can be obtained.

Advantageous Effects of Invention

As described above, according to the film forming apparatus according to the present invention, the in-plane uniformity of the film thickness becomes high and the film forming rate becomes excellent by the simple structure of the apparatus. Further, according to the film forming method of the present invention, it becomes possible to improve the in-plane uniformity of the film thickness and greatly improve the film forming rate by a simple method. In particular, even when forming a film on a large-sized substrate that tends to have non-uniform film thickness, it becomes possible to obtain a higher in-plane uniformity of film thickness at a high film forming rate.

BRIEF DESCRIPTION OF DRAWINGS

FIG. 1 is a schematic configuration diagram showing a film forming apparatus according to the present invention;

FIG. 2 is a diagram illustrating an example of a mist-forming unit of a film forming apparatus according to the present invention;

FIG. 3 is a schematic cross-sectional view showing an example of a film forming chamber of the film forming apparatus according to the present invention.

DESCRIPTION OF EMBODIMENTS

The present invention will be described in detail below, but the present invention is not limited to these.

As described above, in the mist CVD method, it has been demanded a film forming apparatus excellent in in-plane film thickness uniformity and film forming rate and a gallium oxide semiconductor film producing method having an excellent in-plane uniformity of the film thickness and film forming rate.

As a result of intensive studies on the above problems, the inventor of the present invention have found that by a method for producing a gallium oxide semiconductor film by a mist CVD method, comprising, a mist-forming step in which a raw material solution containing gallium is misted in a mist-forming unit to generate mist, a carrier gas supply step of supplying a carrier gas for transferring the mist to the mist-forming unit, a transferring step of transferring the mist from the mist-forming unit to a film forming chamber using the carrier gas via a supply pipe connecting the mist-forming unit and the film forming chamber, a rectification step of rectifying flow of the mist and the carrier gas supplied to a surface of a substrate in the film forming chamber so as to flow along the surface of the substrate, a film forming step of heat-treating the rectified mist to form a film on the substrate, and an exhaust step of exhausting waste gas upward from the substrate, the in-plane uniformity of the film thickness can be improved and the film forming rate can be improved by a simple manufacturing method, and completed the present invention.

Further, the inventor of the present invention have found that by a film forming apparatus comprising at least, a mist-forming unit that turns a raw material solution into mist and generates mist, a carrier gas supply unit for supplying a carrier gas for transferring the mist, a supply pipe that connects the mist-forming unit and a film forming chamber, and through which the mist is transferred by the carrier gas, the film forming chamber for heat-treating the mist supplied together with the carrier gas from a supply port to form a film on a substrate mounted on a substrate mounting portion, wherein, inside the film forming chamber, a middle plate that rectifies flow of the mist and the carrier gas, and an exhaust pipe for exhausting waste gas, are provided, and wherein, the middle plate is positioned above the substrate mounting portion and between the supply port and the substrate mounting portion, and is installed so as to have a certain gap from a side wall of the film forming chamber, the exhaust pipe is connected to an opening in a surface of the middle plate facing the substrate mounting portion, extends upward from the middle plate, and is provided to penetrate a wall of the film forming chamber, and the flow of the mist supplied from the supply port to the film forming chamber together with the carrier gas is rectified by the middle plate so as to flow along a surface of the substrate, and the film is formed on the substrate, the in-plane uniformity of the film thickness is high and the film forming rate is excellent by the simple apparatus configuration have completed the present invention.

In particular, as a result of intensive studies on the above problems, the inventor of the present invention have found that by a method for producing a gallium oxide semiconductor film by a mist CVD method, comprising, a mist-forming step in which a raw material solution containing gallium is misted in a mist-forming unit to generate mist, a carrier gas supply step of supplying a carrier gas for transferring the mist to the mist-forming unit, a transferring step of transferring the mist from the mist-forming unit to a film forming chamber using the carrier gas via a supply pipe connecting the mist-forming unit and the film forming chamber, a rectification step of rectifying flow of the mist and the carrier gas supplied to a surface of a substrate in the film forming chamber so as to flow from the outer circumference of the substrate toward the center of the substrate, a film forming step of heat-treating the rectified mist to form a film on the substrate, and an exhaust step of exhausting waste gas upward from the substrate, the in-plane uniformity of the film thickness can be improved and the film forming rate can be improved by a simple manufacturing method, and completed the present invention.

Further, the inventor of the present invention have found that by a film forming apparatus comprising at least, a mist-forming unit that turns a raw material solution into mist and generates mist, a carrier gas supply unit for supplying a carrier gas for transferring the mist, a supply pipe that connects the mist-forming unit and a film forming chamber, and through which the mist is transferred by the carrier gas, the film forming chamber for heat-treating the mist supplied together with the carrier gas from a supply port to form a film on a substrate mounted on a substrate mounting portion, wherein, inside the film forming chamber, a middle plate that rectifies flow of the mist and the carrier gas, and an exhaust pipe for exhausting waste gas, are provided, and wherein, the middle plate is positioned above the substrate mounting portion and between the supply port and the substrate mounting portion, and is installed so as to have a certain gap from a side wall of the film forming chamber, the exhaust pipe is connected to an opening in a surface of the middle plate facing the substrate mounting portion, extends upward from the middle plate, and is provided to penetrate a wall of the film forming chamber, and the flow of the mist supplied from the supply port to the film forming chamber together with the carrier gas is rectified by the middle plate so as to flow from the outer circumference of the substrate toward the center of the substrate, and the film is formed or the substrate, the in-plane uniformity of the film thickness is high and the film forming rate is excellent by the simple apparatus configuration have completed the present invention.

Here, the mist in the present invention refers to a general term for fine particles of a liquid dispersed in a gas, and includes those called mist, droplets, or the like.

Hereinafter, description will be made with reference to the drawings.

First Embodiment (Film Forming Apparatus)

FIG. 1 shows art example of a film forming apparatus 101 according to the present invention. The film forming apparatus 101 includes at least a mist-forming unit 120 that forms mist from a raw material solution 104a to generate mist, a carrier gas supply unit 130 that supplies a carrier gas for transferring the mist, a supply pipe 109a that connects the mist-forming unit 120 and a film forming chamber 300, through which mist is transferred by a carrier gas, and the film forming chamber 300 in which the mist supplied together with the carrier gas from a supply port 301 is heat-treated to form a film on a substrate 310 mounted on a substrate mounting portion 313.

(Mist-Forming Unit)

In the mist-forming unit 120, the raw material solution 104a is made into mist to generate mist. The mist-forming means is not particularly limited as long as the raw material solution 104a can be made into mist, and may be a known mist-forming means, but it is preferable to use a mist-forming means by ultrasonic vibration. This is because it can be made into mist more stably.

An example of such a mist-forming unit 120 will be described with reference to FIG. 2 as well. For example, the mist-forming unit 120 may include a mist generation source 104 containing a raw material solution 104a, a container 105 containing a medium capable of transmitting ultrasonic vibrations, such as water 105a, and an ultrasonic wave vibrator 106 attached to the bottom surface of the container 105. Specifically, the mist generation source 104, which is a container containing the raw material solution 104a, can be accommodated in the container 105 containing the water 105a using a support (not shown). An ultrasonic vibrator 106 may be provided at the bottom of the container 105, and the ultrasonic vibrator 106 and the oscillator 116 may be connected. It can be configured so that when the oscillator 116 is operated, the ultrasonic vibrator 106 vibrates, ultrasonic wave propagate into the mist generation source 104 through the water 105a, and the raw material solution 104a becomes mist.

(Raw Material Solution)

The raw material solution 104a contains at least gallium, and the material contained in the solution is not particularly limited as long as it can be misted, and may be an inorganic material or an organic material. In addition to gallium, metals or metal compounds may be mixed, for example, containing one or two or more metals selected from Iron, indium, aluminum, vanadium, titanium, chromium, rhodium, nickel and cobalt may be used.

The raw material solution is not particularly limited as long as the above mentioned metal can be misted, but as the raw material solution, a metal in the form of a complex or a salt dissolved or dispersed in an organic solvent or water can be suitably used. As examples of forms of the complex, acetylacetonate complexes, carbonyl complexes, ammine complexes, hydride complexes, and the like can be mentioned. As salt forms, for example, metal chloride salts, metal bromide salts, and metal iodide salts, and the like can be mentioned. In addition, a solution obtained by dissolving the above metal in hydrobromic acid, hydrochloric acid, hydroiodic acid, or the like can also be used as an aqueous salt solution.

Additives such as hydrohalic acid and oxidizing agents may be mixed in the raw material solution. As the hydrohalic acid, for example, hydrobromic acid, hydrochloric acid, hydroiodic acid, and the like can be mentioned. Among them, hydrobromic acid and hydroiodic acid are preferable. As examples of oxidizing agents, peroxides such as hydrogen peroxide ($H_2O_2$), sodium peroxide ($Na_2O_2$), barium peroxide ($BaO_2$), benzoyl peroxide ($C_6H_5CO)_2O_2$), hypochlorous acid (HClO), perchloric acid, nitric acid, ozone water, and organic peroxides such as peracetic acid and nitrobenzene can be mentioned.

Furthermore, the raw material solution may contain a dopant. A dopant is not specifically limited. For example, n-type dopants such as tin, germanium, silicon, titanium, zirconium, vanadium or niobium, or p-type dopants such as copper, silver, tin, iridium and rhodium can be mentioned. The dopant concentration may be, for example, about $1\times10^{16}/cm^3$ to $1\times10^{22}/cm^3$, and may be as low as about $1\times10^{17}/cm^3$ or less, or as high as about $1\times10^{20}/cm^3$ or more.

(Carrier Gas Supply Unit)

As shown in FIG. 1, the carrier gas supply unit 130 has a carrier gas source 102a for supplying the carrier gas. At this time, a flow control valve 103a for adjusting the flow rate of the carrier gas sent out from the carrier gas source 102a may be provided. In addition, a carrier gas source 102b for dilution that supplies a carrier gas for dilution and a flow control valve 103b for adjusting the flow rate of the carrier gas for dilution sent out from the carrier gas source 102b for dilution can also be provided as necessary.

The type of carrier gas is not particularly limited and can be appropriately selected depending on the film. For example, oxygen, ozone, an inert gas such as nitrogen or argon, or a reducing gas such as hydrogen gas or forming gas can be mentioned. Further, the type of carrier gas may be one type or two or more types. For example, a diluted gas obtained by diluting the same gas as the first carrier gas with another gas (for example, diluted 10-fold) may be further used as the second carrier gas, or air may be used. The flow rate of carrier gas is not particularly limited. For example, when forming a film on a 30 mm square substrate, the flow rate of the carrier gas is preferably 0.01 to 20 L/min, more preferably 1 to 10 L/min.

(Supply Pipe) The film forming apparatus 101 has a supply pipe 109 that connects the mist-forming unit 120 and the film forming chamber 300. In this case, the mist is transferred by the carrier gas from the mist generation source 104 of the mist-forming unit 120 through the supply pipe 109 and supplied into the film forming chamber 300. A quartz tube, a resin tube, or the like can be used as the supply tube 109, for example.

(Film Forming Chamber)

FIG. 3 is a schematic cross-sectional view showing an example of a film forming chamber 300 (same as the film forming chamber 300 in FIG. 1) of the film forming apparatus according to the present invention. The film forming chamber 300 is basically closed, and includes at least one supply port 301 that is an inlet for mist, an exhaust pipe 312 that exhausts waste gas upward from the substrate 310, and a middle plate 321 that rectifies the flow of mist and carrier gas. The supply port 301 is connected to the supply pipe 109 to supply mist into the film forming chamber 300.

By providing a position adjusting mechanism for the opening of the supply port 301, it is possible to change the tip position of the supply port 301 an the film forming chamber 300 according to the film forming situation, thereby changing the position from which mist and carrier gas are ejected.

(Middle Plate)

The film forming chamber 300 shown in FIG. 3 has a middle plate 321 above the substrate mounting portion 313 and between the supply port 301 and the substrate mounting portion 313. Further, a certain gap 322 is formed between the outer circumference of the middle plate 321 and the inner side wall of the film forming chamber 300. By installing such a middle plate 321 inside the film forming chamber 300, the flow of mist supplied from the supply port 301 to the film forming chamber 300 together with the carrier gas passes through the gap 322 between the side wall of the chamber 300 and the middle plate 321 and further through a gap 323 between the substrate 310 and the middle plate 321. That is, the mist is rectified such that it flows from the outer circumference of the substrate 310 toward the center of the substrate 310, and the flow rate and direction of the mist can be made uniform. It is preferable that the middle plate 321 has a size that completely covers the substrate 310 (substrate mounting portion 313). As a result, the utilization efficiency of the mist is improved, and the flow rate and direction of the mist can be made uniform. The shape of the middle plate 321 is preferably circular, but is not particularly limited. The material of the middle plate 321 is not particularly limited, but it is preferable to use a material that does not react with the mist.

The gap 322 between the outer circumference of the middle plate 321 and the inner side wall of the film forming chamber 300 is preferably 0.1 to 10 mm. If the gap 322 is in such a range, it is possible to effectively suppress variations occurring in the gap and one-sided flow of gas containing mist, and the flow of mist on the substrate 310 becomes more uniform. The gap 322 may be changed according to film formation conditions. For example, if the middle plate 321 is circular, two or more types of plates with different diameters are prepared, and the space 322 can be arbitrarily changed by replacing the plates. The gap 323 between the middle plate 321 and the substrate 310 is preferably 0.5 to 10 mm. If the gap 323 is within such a range, the flow of gas containing mist can be made more stable, and the utilization efficiency of the mist can be maintained at a higher level. The gap 323 may be changed according to film formation conditions. For example, the gap 323 can be arbitrarily changed by providing a mechanism for adjusting the height of the middle plate 321 in advance.

(Exhaust Pipe)

The exhaust pipe 312 is provided so that it is connected to an opening in the surface of the middle plate 321 facing the substrate mounting portion 313, extends upward from the middle plate 321, and penetrates the wall of the film forming chamber 300, for example, the ceiling. The position of the opening of the exhaust pipe 312 is not particularly limited. It is preferable that the center of the middle plate, the center of the opening and the center of the substrate mounting portion 313 are aligned with each other to exhaust waste gas not used during the film formation among the gas flown from the outer circumference of the substrate 310 toward the center. The diameter of the opening of the middle plate 321 connected to the exhaust pipe 312 is appropriately set, and may be 1 to 15 mm.

By configuring the film forming chamber 300 as described above, the mist can be rectified by the middle plate 321 and flowed uniformly from the outer circumference toward the center of the substrate 310 at the same flow rate. Furthermore, the closer to the center of the substrate 310, the greater becomes the volumetric flow rate per area, so there is an effect of apparently suppressing consumption of mist by film formation. Due to these effects, variations in film thickness can be extremely reduced at a high film forming rate.

(Substrate Mounting Portion)

The substrate 310 is mounted on the substrate mounting surface 314 of the substrate mounting portion 313 in the film forming chamber 300. Here, the substrate mounting portion 313 refers to a portion of a member that supports the substrate 310 and faces the lower surface of the substrate 310 when the substrate 310 is placed on the member that supports the substrate 310. Also, the substrate mounting surface 314 refers to a surface that supports the substrate 310. Heating means for heating the substrate 310 and heat-treating the mist can be provided under the substrate 310. Although the heating means is not particularly limited, a hot plate 308 can be used, for example. The hot plate 308 may be provided inside the film forming chamber 300 as shown in FIG. 3 or may be provided outside the film forming chamber 300. The hot plate 308 may form the entire bottom surface of the film forming chamber 300, but may be slightly larger than the substrate 310 or may be approximately the same size as the substrate 310. As a result, reaction of mist outside the substrate 310 can be suppressed, and a higher quality film can be obtained. Moreover, it is preferable that a heating region has approximately the same size, more preferably the same size as the substrate mounting portion 313.

The substrate mounting portion 313 can also be provided with cooling means. By performing cooling at the same time as heating, it is possible to prevent local temperature rise and overshoot of temperature rise, enabling more accurate temperature control. Although the cooling means is not particularly limited, for example, a Peltier device can be used, and a system of circulating a cooling liquid can also be used.

The substrate mounting portion 313 may be provided with a rotation mechanism for rotating the substrate 310 during film formation, thereby further reducing variations in film thickness.

A mechanism for adsorbing the substrate 310 may be provided on the substrate mounting portion 313. Adsorption of the substrate increases the efficiency and uniformity of heat transfer, enabling the temperature to be raised and lowered in a shorter period of time, and the temperature distribution of the substrate to be more uniform. In addition, it becomes possible to prevent the substrate from slipping or deviating when the rotating mechanism described above is used. Although the adsorbing means is not particularly limited, for example, adsorbing using static electricity or adsorbing using vacuum is possible.

Further, it is preferable that the heating region is, for example, a block made of metal with good thermal conductivity placed under the substrate 310 or a convex shape formed on the hot plate 308, it is also preferable to set the position of the height of the substrate mounting surface 314 higher than the circumference of the substrate mounting portion 313, and may be positioned about 1 to 50 mm higher than the circumference. By doing so, it becomes possible to suppress supply onto the substrate 310 of mist that has reacted outside the substrate 310, so that a higher quality film can be obtained.

(Substrate)

The substrate 310 is not particularly limited as long as it can form a film and can support a film. The material of the substrate 310 is also not particularly limited, and a known substrate can be used, and it may be an organic compound or an inorganic compound. For example, organic compounds such as polysulfone, polyethersulfone, polyphenylene sulfide, an the outer circumference of the substrate mounting fluororesin, metals such as iron, aluminum, stainless steel, and gold, silicon, sapphire, quartz, glass, inorganic compounds such as lithium tantalate, potassium tantalate, and gallium oxide can be mentioned, but are not limited to these. Although the thickness of the substrate is not particularly limited, it is preferably 10 to 2000 μm, more preferably 50 to 800 μm.

The size of the substrate 310 is not particularly limited, but the larger the area of the substrate 310 becomes, the more likely the film thickness becomes uneven, and the effect of the present invention becomes remarkable. Therefore, in the present invention, it is preferable to use a substrate with an area of 100 mm² or more, or a substrate with a diameter of 2 inches (50 mm) or more, and a substrate with a diameter of 2 to 8 inches (50 to 200 mm) or more can also be used. As described above, the larger the area becomes, the more pronounced the effect of the present invention becomes, which is preferable. Therefore, no decision can be made regarding the maximum area or diameter of the substrate.

(Producing Method of Gallium Oxide Semiconductor Film)

Next, an example of a method for producing a gallium oxide semiconductor film according to the present invention will be described with reference to FIG. 1.

First, the raw material solution 104a containing gallium is placed in the mist generation source 104, the substrate 310 is placed on the hot plate 308 directly or via the wall of the film forming chamber 300, and the hot plate 308 is operated. Next, the flow control valves 103a and 103b are opened to supply the carrier gas from the carrier gas sources 102a and 102b into the film forming chamber 300. After sufficiently replacing the atmosphere in the film forming chamber 300 with the carrier gas, the flow rate of the carrier gas and the flow rate of the carrier gas for dilution are adjusted respectively.

Next, as a mist-forming step, the ultrasonic oscillator 106 is vibrated, and the vibration is propagated to the raw material solution 104a through the water 105a, thereby misting the raw material solution 104a and generating mist.

Next, as a carrier gas supply step, a carrier gas for transferring mist is supplied to the mist-forming unit 120.

Next, as a transferring step, the mist is transferred with a carrier gas from the mist-forming unit 120 to the film forming chamber 300 via the supply pipe 109 that connects the mist-forming unit 120 and the film forming chamber 300. The mist is supplied from above the middle plate 321, and may be supplied not only from one direction but also from a plurality of directions.

Next, as a rectification step, the flow of mist and the carrier gas supplied to the surface of the substrate 310 in the film forming chamber 300 is rectified so as to flow from the outer circumference of the substrate 310 toward the center of the substrate 310. The mist is rectified by the middle plate 321 in the film forming chamber 300 to form a uniform flow parallel to the surface of the substrate 310.

Next, as a film forming step, the rectified mist is heat-treated to form a film on the substrate 310. The mist thermally reacts with the heat of the hot plate 308 in the film forming chamber 300 and forms a film on the substrate 310.

In the film forming chamber 300, the mist is heated to cause a thermal reaction to form a film on the substrate 310. The thermal reaction is not particularly limited as long as the mist reacts by heating. It can be appropriately set according to the raw material and the film-formed material. For example, the heating temperature can be in a range of 120-600° C., preferably in a range of 200-600° C., more preferably in a range of 300-550° C.

Moreover, the thermal reaction may be carried out in vacuum, in a non-oxygen atmosphere, in a reducing gas atmosphere, in an air atmosphere, or in an oxygen atmosphere, and may be appropriately set according to the film to be formed. In addition, the reaction pressure may be any one of atmospheric pressure, increased pressure, and reduced pressure, but film formation under atmospheric pressure is preferable because the apparatus configuration can be simplified.

Here, as an exhaust step, the waste gas is exhausted above the substrate 310. The gas in the film forming chamber 300 is exhausted to the outside of the film forming chamber 300 through the exhaust pipe 312 provided above the substrate 310.

By supplying the mist in this manner, the mist introduced into the film forming chamber 300 becomes uniform and dense over a wide area above the substrate 310, thereby improving the in-plane distribution of the film thickness. The film forming rate can also be increased.

(Buffer Layer)

In forming the film containing gallium oxide, a buffer layer may be appropriately provided between the substrate and the film. As materials for the buffer layer, $Al_2O_3$, $Ga_2O_3$, $Cr_2O_3$, $Fe_2O_3$, $In_2O_3$, $Rh_2O_3$, $V_2O_3$, $Ti_2O_3$, $Ir_2O_3$ or the like are preferably used. The method of forming the buffer Layer is not particularly limited, and the film can be formed by a known method such as a sputtering method or a vapor deposition method. It is simple and easy to form it by changing the raw material solution for the buffer layer appropriately if mist CVD method is used. Specifically, one or two or more metals selected from aluminum, gallium, chromium, iron, indium, rhodium, vanadium, titanium, and iridium are dissolved or dispersed in water in the form of complexes or salts, can be suitably used as the raw material aqueous solution for the buffer layer. As examples of forms of the complex, acetylacetonate complexes, carbonyl complexes, ammine complexes, hydride complexes, and the like can be mentioned. As salt forms, for example, metal chloride salts, metal bromide salts, metal iodide salts and the like can be mentioned. In addition, a solution obtained by dissolving the above metal in hydrobromic acid, hydrochloric acid, hydroiodic acid, or the like can also be used as an aqueous salt solution. The solute concentration of the raw material solution for the buffer layer is preferably 0.01 to 1 mol/L. For other conditions, the buffer layer can also be formed under the same conditions as above. After forming a buffer layer with a predetermined thickness, an oxide semiconductor film containing gallium as a main component is formed by the above method. The thickness of the buffer layer is preferably 0.1 μm to 2 μm.

(Heat Treatment)

Also, the film obtained by the method for producing a gallium oxide semiconductor film according to the present invention may be heat-treated at 200 to 600° C. As a result, unreacted species and the like in the film are removed, and a higher quality laminated structure can be obtained. The heat treatment may be performed in air, in an oxygen atmosphere, or in an inert gas atmosphere such as nitrogen or argon. The heat treatment time is appropriately determined, and can be, for example, 5 to 240 minutes.

Second Embodiment

In addition to the film forming apparatus and gallium oxide semiconductor film producing method in the first embodiment described above, the following apparatus and method are also possible.

Regarding the second embodiment, the film forming apparatus will be described first. In the first embodiment, the mist and carrier gas are rectified so as to flow from the outer circumference (peripheral side) of the substrate 310 toward the center of the substrate 310. However, in the second embodiment, more as a broad form, it is rectified so as to flow along the surface of the substrate 310. That is, the mist and carrier gas are rectified so as to flow along the surface of the substrate 310 toward the opening of the exhaust pipe 312. In-plane uniformity of film thickness and growth rate can be conveniently improved compared to conventional apparatus, even by such an apparatus. The position of the opening of the exhaust pipe 312 may be near or far from the center of the substrate 310.

In addition, by providing a lateral position adjustment mechanism for the middle plate 321, the position of the middle plate 321 can be changed in accordance with the movement of the supply port 301 according to the film formation state.

As for the exhaust pipe 312, by providing a position adjusting mechanism for the exhaust pipe 312, the relative position between the opening at the lower end of the exhaust pipe 312 and the substrate 310 can be changed according to the film formation state. In this case, the middle plate 321 may be fixed to the exhaust pipe 312 and the position thereof may be changed integrally. A configuration in which the exhaust pipe 312 moves in an opening range of the opening may be adopted by making size of the opening of the middle plate 321 through which the exhaust pipe 312 penetrates, larger than the size of the exhaust pipe 312.

By configuring the film forming chamber 300 as described above, the mist can be rectified by the middle plate 321 and flowed uniformly along the surface of the substrate 310 (particularly parallel to the surface of the substrate 310) at the same flow rate. Furthermore, since the volumetric flow rate per area increases as the mist flow is approached to the opening of the arranged exhaust pipe 312, there is an effect of apparently suppressing consumption of mist by film formation. Due to these effects, variations in film thickness can be extremely reduced at a high film forming rate. By appropriately changing the position of the opening of the exhaust pipe 312 according to the film formation situation, the film thickness fluctuation can be further reduced.

In particular, for example, the center of the middle plats 321 and the center of its opening (the position of the opening of the exhaust pipe 312) can be arranged so as to coincide with the center of the substrate mounting portion 313. With such a simpler configuration, the mist and carrier gas can more reliably flow at the same flow rate from the outer circumference (peripheral side) of the substrate 310 along the surface of the substrate 310 toward the center (towards the opening of the exhaust pipe 312 located in the center direction) uniformly. In this case, the configuration is substantially the same as that of the first embodiment.

In this manner, the relative positions of the center of the middle plate 321, the exhaust pipe 312, and the center of the substrate 310 can be changed as appropriate according to the film formation situation before or during film formation.

It should be noted that the lateral position adjusting mechanism for the middle plate 321 and the position adjusting mechanism for the exhaust pipe 312 itself can be provided in the first embodiment as well. In the first embodiment, as described repeatedly, as a result, the flow of mist and carrier gas may be rectified by the middle plate 321 so as to flow from the outer circumference (peripheral side) of the substrate 310 toward the center.

Furthermore, as a method for producing a gallium oxide semiconductor film in the second embodiment, the flow of mist and carrier gas supplied to the surface of the substrate 310 in the film forming chamber 300 is rectified so as to flow along the surface of the substrate 310 (in particular, a flow parallel to the surface of the substrata 310) during the rectification step. The middle plate 321 in the film forming chamber 300 can rectify the mist and carrier gas as described above, the effect of greatly improving the in-plane uniformity of the film thickness and the film forming rate can be obtained conveniently.

At this time, in particular, the flow can be rectified so as to flow from the outer circumference (peripheral side) of the substrate 310 toward the center of the substrate 310. As described above, for example, by arranging the center of the middle plate 321 and the center of its opening (the position of the opening of the exhaust pipe 312) and the center of the substrate mounting portion 313 to coincide with each other, it is easier and more reliable to obtain the above effect. In this case, the method is substantially the same as the method of the first embodiment.

EXAMPLE

The present invention will be specifically described below with reference to Examples, but these are not intended to limit the present invention.

Example 1

(Film Forming Apparatus)

A film forming apparatus 101 (first embodiment) used in this example will be described with reference to FIG. 1. The film forming apparatus 101 is provided a carrier gas source 102*a* that supplies a carrier gas, a flow control valve 103*a* that adjusts the flow rate of the carrier gas sent from the carrier gas source 102*a*, and a source 102*b* for carrier gas for dilution that supplies carrier gas for dilution, a flow control valve 103*b* for adjusting the flow rate of the carrier gas for dilution sent out from the source 102*b* for carrier gas for dilution, a mist generation source 104 containing a raw material solution 104*a*, and a container 105 containing water 105*a*, an ultrasonic oscillator 106 attached to the bottom surface of the container 105, a film forming chamber 300, a quartz supply pipe 109 connecting the mist generating source 104 to the film forming chamber 300, and a hot plate 308 inside of the film forming chamber 300. A substrate 310 is placed in the film forming chamber 300 and heated by a hot plate 308.

A middle plate 321 having a diameter of 120 mm was provided in the film forming chamber 300, and an opening having a diameter of 10 mm was provided in the center and connected to an exhaust pipe 312. A gap 322 between the middle plate 321 and the side wall of the film forming chamber 300 was 4 mm, and a gap 323 between the middle plate 321 and the substrate 310 was also 4 mm. An exhaust pipe 312 extending from the middle plate 321 was penetrated the ceiling of the film forming chamber 300.

(Substrate)

A c-plane sapphire substrate with a diameter of 4 inches (100 mm) as the substrate 310 was placed on the hot plate 308 in the film forming chamber 300, and the hot plate 308 was operated to raise the temperature to 500° C. A Cu block having a diameter of 101 mm and a height of 13 mm was placed under the substrata 310, and the substrate 310 was raised while the temperature was kept constant.

(Raw Material Solution)

An aqueous solution of 0.1 mol/L of gallium bromide was prepared, and a 40% hydrobromic acid solution was added so that the volume ratio was 10%, which was used as the raw material solution 104*a*.

(Film Formation)

The raw material solution 104*a* obtained as described above was accommodated in the mist generation source 104. Next, the flow control valves 103*a* and 103*b* were opened to supply the carrier gas from the carrier gas sources 102*a* and 102*b* into the film forming chamber 300. After sufficiently replacing the atmosphere in the film forming chamber 300 with the carrier gas, the flow rate was adjusted to 10 L/min, and the flow rate of the carrier gas for dilution was adjusted to 30 L/min. Oxygen was used as the carrier gas.

Next, the ultrasonic vibrator 106 was oscillated at 2.4 MHz, and the vibration was propagated to the raw material solution 104*a* through the water 105*a*, thereby misting the raw material solution 104*a* to generate mist. This mist was introduced into the film forming chamber 300 through the supply pipe 103 by carrier gas. A thin film of gallium oxide ($\alpha$-Ga$_2$O$_3$) having a corundum structure was formed on the substrate 310 by thermally reacting the mist in the film forming chamber 300 at 500° C. under atmospheric pressure. The film formation time was 30 minutes.

For the thin film formed on the substrate 310, the measurement points were 17 points on the surface of the substrate 310, and the film thickness was measured using an optical interference type film thickness meter, and average thickness, film forming rate and standard deviation were calculated.

As a result, the average film thickness was 5.0 μm, the film forming rate was 10.0 μm/hour, and the standard deviation was 0.3 μm.

Example 2

Film formation and evaluation were performed under the same conditions as in Example 1, except that the flow rate of the carrier gas was 5 L/min and the flow rate of the carrier gas for dilution was 15 L/min. As a result, the average film thickness was 2.4 μm, the film forming rate was 4.8 μm/hour, and the standard deviation was 0.1 μm.

Example 3

Film formation and evaluation were performed under the same conditions as in Example 1, except that the flow rate of the carrier gas for dilution was 60 L/min. As a result, the average film thickness was 4.7 μm, the film forming rate was 9.4 μm/hour, and the standard deviation was 0.2 μm.

Comparative Example

Film formation and evaluation were performed under the same conditions as in Example 1, except that the middle plate 321 of the film forming chamber 300 was not provided. As a result, the average film thickness was 0.7 μm, the film forming rate was 1.4 μm/hour, and thus, almost no film could be formed. In addition, the standard deviation was 0.4 μm, and considering that the film thickness was thin, the variation was very large as a result.

As described above, with the configuration of the film forming apparatus according to the present invention and the method for producing gallium oxide according to the present invention, even if a substrate having a large area was used, a gallium oxide film with sufficient thickness could be formed with excellent film forming rate and in-plane uniformity.

The present invention is not limited to the above embodiments. The above-described embodiments are just examples, and any examples that substantially have the same configuration and demonstrate the same functions and effects as those in the technical concept disclosed in the claims of the present invention are included in the technical scope of the present invention.

The invention claimed is:

1. A method for producing a gallium oxide semiconductor film by a mist CVD method, comprising,
a mist-forming step in which a raw material solution containing gallium is misted in a mist-forming unit to generate mist,
a carrier gas supply step of supplying a carrier gas for transferring the mist to the mist-forming unit, a transferring step of transferring the mist from the mist-forming unit to a film forming chamber using the carrier gas via a supply pipe connecting the mist-forming unit and the film forming chamber, a rectification step of rectifying flow of the mist and the carrier gas supplied to a surface of a substrate in the film forming chamber so as to flow along the surface of the substrate by a middle plate which is installed in the film forming chamber so as to have a gap of 0.5 to 10 mm from the substrate, a film forming step of heat-treating the rectified mist by heating means provided under the substrate in the film forming chamber to form a film on the substrate, and an exhaust step of exhausting waste gas upward from the substrate, wherein relative positions of the rectification step of the mist and the carrier gas or the exhaust step and the substrate is changed during film formation.

2. The method for producing a gallium oxide semiconductor film according to claim 1, wherein a substrate having an area of 100 mm² or more or a diameter of 2 inches (50 mm) or more is used as the substrate.

3. The method for producing a gallium oxide semiconductor film according to claim 1, wherein the flow of the mist and the carrier gas supplied to the surface of the substrate is rectified so as to flow from the outer circumference of the substrate toward the center of the substrate in the rectification step.

4. The method for producing a gallium oxide semiconductor film according to claim 2, wherein the flow of the mist and the carrier gas supplied to the surface of the substrate is rectified so as to flow from the outer circumference of the substrate toward the center of the substrate in the rectification step.

5. A film forming apparatus comprising at least, a mist-forming unit that turns a raw material solution into mist and generates mist, a carrier gas supply unit for supplying a carrier gas for transferring the mist, a supply pipe that connects the mist-forming unit and a film forming chamber, and through which the mist is transferred by the carrier gas, the film forming chamber for heat-treating the mist supplied together with the carrier gas from a supply port to form a film on a substrate mounted on a substrate mounting portion, wherein, heating means for heating the substrate and heat-treating the mist is provided under the substrate mounted on the substrate mounting portion, inside the film forming chamber, a middle plate that rectifies flow of the mist and the carrier gas, and an exhaust pipe for exhausting waste gas, are provided, and wherein, the middle plate is positioned above the substrate mounting portion and between the supply port and the substrate mounting portion, and is installed so as to have a gap from a side wall of the film forming chamber and have a gap of 0.5 to 10 mm from the substrate, the exhaust pipe is connected to an opening in a surface of the middle plate facing the substrate mounting portion, extends upward from the middle plate, and is provided to penetrate a wall of the film forming chamber, and the flow of the mist supplied from the supply port to the film forming chamber together with the carrier gas is rectified by the middle plate so as to flow along a surface of the substrate, and the film is formed on the substrate, and relative positions of the middle plate, the opening at the lower end of the exhaust pipe, and the substrate is capable of change during film formation.

6. The film forming apparatus according to claim 5, wherein a substrate having an area of 100 mm² or more, or a substrate having a diameter of 2 inches (50 mm) or more is treated.

7. The film forming apparatus according to claim 6, wherein the film is formed on the substrate by arranging the flow of the mist supplied from the supply port to the film forming chamber together with the carrier gas being rectified by the middle plate so as to flow from the outer circumference of the substrate toward the center of the substrate.

8. The film forming apparatus according to claim 7, wherein the substrate mounting portion has a substrate mounting surface at a position higher than the outer circumference of the substrate mounting portion in an inside of the film forming chamber, and the middle plate has a size that completely covers the substrate.

9. The film forming apparatus according to claim 8, wherein a heating region for performing the heat-treating of the mist has the same size as the substrate mounting portion in the film forming chamber.

10. The film forming apparatus according to claim 7, wherein a heating region for performing the heat-treating of the mist has the same size as the substrate mounting portion in the film forming chamber.

11. The film forming apparatus according to claim 6, wherein the substrate mounting portion has a substrate mounting surface at a position higher than the outer circumference of the substrate mounting portion in an inside of the film forming chamber, and the middle plate has a size that completely covers the substrate.

12. The film forming apparatus according to claim 11, wherein a heating region for performing the heat-treating of the mist has the same size as the substrate mounting portion in the film forming chamber.

13. The film forming apparatus according to claim 6, wherein a heating region for performing the heat-treating of the mist has the same size as the substrate mounting portion in the film forming chamber.

14. The film forming apparatus according to claim 5, wherein the film is formed on the substrate by arranging the flow of the mist supplied from the supply port to the film forming chamber together with the carrier gas being rectified by the middle plate so as to flow from the outer circumference of the substrate toward the center of the substrate.

15. The film forming apparatus according to claim 14, wherein the substrate mounting portion has a substrate mounting surface at a position higher than the outer circumference of the substrate mounting portion in an inside of the film forming chamber, and the middle plate has a size that completely covers the substrate.

16. The film forming apparatus according to claim 15, wherein a heating region for performing the heat-treating of the mist has the same size as the substrate mounting portion in the film forming chamber.

17. The film forming apparatus according to claim 14, wherein a heating region for performing the heat-treating of the mist has the same size as the substrate mounting portion in the film forming chamber.

18. The film forming apparatus according to claim 5, wherein the substrate mounting portion has a substrate mounting surface at a position higher than the outer circumference of the substrate mounting portion in an inside of the film forming chamber, and the middle plate has a size that completely covers the substrate.

19. The film forming apparatus according to claim 18, wherein a heating region for performing the heat-treating of the mist has the same size as the substrate mounting portion in the film forming chamber.

20. The film forming apparatus according to claim 5, wherein a heating region for performing the heat-treating of the mist has the same size as the substrate mounting portion in the film forming chamber.

21. The film forming apparatus according to claim 5, wherein the middle plate is installed so as to have a certain gap from the side wall of the film forming chamber.

\* \* \* \* \*